(12) United States Patent
Enomoto et al.

(10) Patent No.: US 8,497,625 B2
(45) Date of Patent: Jul. 30, 2013

(54) LIGHT EMITTING MODULE AND PHOSPHOR

(75) Inventors: Kiminori Enomoto, Shizuoka (JP); Hisayoshi Daichou, Shizuoka (JP)

(73) Assignee: Koito Manufacturing Co., Ltd., Minato-ku, Tokyo (JP)

( * ) Notice: Subject to any disclaimer, the term of this patent is extended or adjusted under 35 U.S.C. 154(b) by 0 days.

(21) Appl. No.: 13/611,922

(22) Filed: Sep. 12, 2012

(65) Prior Publication Data

US 2013/0076234 A1 Mar. 28, 2013

(30) Foreign Application Priority Data

Sep. 28, 2011 (JP) .................. 2011-213411

(51) Int. Cl.
*H01L 33/50* (2010.01)
(52) U.S. Cl.
USPC ............. 313/503; 313/504; 313/512; 257/98

(58) Field of Classification Search
CPC ......... H01L 33/62; H01L 33/60; H01L 25/753; F21K 9/00; F21K 9/56
USPC ........................ 313/504–512; 257/98–99, 40
See application file for complete search history.

(56) References Cited

U.S. PATENT DOCUMENTS

| 2009/0250663 A1* | 10/2009 | Oshio ................ 252/301.4 R |
| 2010/0224829 A1* | 9/2010 | Ito et al. ................ 252/301.4 F |
| 2011/0182072 A1* | 7/2011 | Shimizu et al. ............... 362/293 |

FOREIGN PATENT DOCUMENTS

JP 2005-060468 3/2005

* cited by examiner

*Primary Examiner* — Tracie Y Green
(74) *Attorney, Agent, or Firm* — Fish & Richardson P.C.

(57) ABSTRACT

A light emitting module includes a light emitting device that emits ultraviolet rays or short-wavelength visible light, a blue phosphor that is excited by the ultraviolet rays or the short-wavelength visible light to emit visible light. The blue phosphor is represented by a general formula of $(Ca_{1-x-y}, Sr_x, Eu_y)_5 (PO_4)_3Cl$, wherein $0.10<x<0.60$, $0.002<y<0.060$, and $0.02<y/(x+y)<0.17$.

5 Claims, 3 Drawing Sheets

LIGHT EMITTING MODULE AND PHOSPHOR

CROSS-REFERENCE TO RELATED APPLICATION(S)

The present application claims the benefit of priority of Japanese Patent Application No. 2011-213411, filed on Sep. 28, 2011, the contents of which are incorporated herein by reference.

TECHNICAL FIELD

The present disclosure relates to a phosphor that emits blue light and a light emitting module using the phosphor.

BACKGROUND

Conventionally, fluorescent lamps and light bulbs have been widely used as illumination lamps. Recently, in view of power consumption and service life, various light emitting devices using light emitting diodes (LEDs) are being developed as substitutes for the conventional lamps.

A related art light emitting device provides white light by a combination of a semiconductor light emitting device that emits near ultraviolet rays, a blue phosphor, and a yellow phosphor. For example, a light emitting device has a first light emitter that emits light of 350 nm to 415 nm and a second light emitter that emits visible light when irradiated with the light from the first light emitter, the second light emitter having a chemical composition represented by a general formula of $Eu_aCa_bM_{5-a-b}(PO_4)_cX_d$, where M is a metal element other than Eu and Ca, and X is a monovalent anionic group other than $PO_4$ (see, e.g., JP 2005-060468 A).

Light emitting devices, such as LEDs, are also being used in recent vehicle headlamps. When using LEDs in a headlamp, it is advantageous to reduce the number of LEDs in terms of reducing cost, in which case the output per one LED increases.

However, in a light emitting device using a combination of a high output LED and a phosphor, the high output LED may deteriorate the phosphor and cause reduction in light emission intensity of the light emitting device.

SUMMARY

The present disclosure provides a light emitting module and a phosphor which can suppress reduction in light emission intensity.

According to an aspect of the present disclosure, a light emitting module includes a light emitting device that emits ultraviolet rays or short-wavelength visible light, and a blue phosphor that is excited by the ultraviolet rays or the short-wavelength visible light to emit visible light. The blue phosphor is represented by a general formula of $(M^1_{1-x-y}, M^2_x, M^3_y)_5(M^4O_4)_3X$, where each of $M^1$, $M^2$ and $M^3$ is a divalent alkaline earth metal, the alkaline earth metal being one or more elements selected from a group consisting of Mg, Ca, Sr, Ba and Eu, $M^4$ is one or more elements selected from a group consisting of P, Si and V, and X is one or more halogen elements. It is advantageous that the blue phosphor is represented by a general formula of $(Ca_{1-x-y}, Sr_x, Eu_y)5(PO_4)_3Cl$, where $0.10<x<0.60$, $0.002<y<0.060$, and $0.02<y/(x+y)<0.17$.

According to another aspect of the present disclosure, a phosphor is represented by a general formula of $(Ca_{1-x-y}, Sr_x, Eu_y)_5(PO_4)_3Cl$, where $0.10<x<0.60$, $0.002<y<0.060$, and $0.02<y/(x+y)<0.17$.

Other aspects, features and advantages will be apparent from the following description, the drawings and the claims.

DETAILED DESCRIPTION

Figure 1:
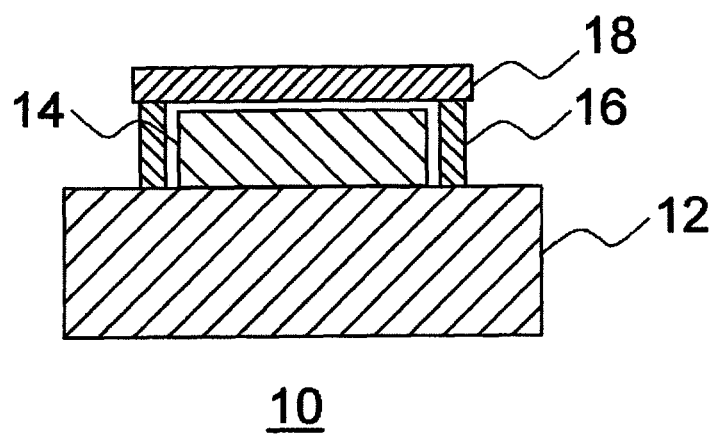
FIG. 1 is a schematic cross-sectional view of a light emitting module.

Hereinafter, an implementation of the invention will be described below in detail with reference to the drawings.

Blue Light Emitting Phosphor

First, composition of a blue light emitting phosphor (hereinafter "blue phosphor") with improved light resistance will be described. The blue phosphor is represented by a general formula of $(Ca_{1-x-y}, Sr_x, Eu_y)_5(PO_4)_3Cl$, where $0.10<x<0.60$, $0.002<y<0.060$, and $0.02<y/(x+y)<0.17$.

The blue phosphor may be represented by a general formula of $(M^1_{1-x-y}, M^2_x, M^3_y)_5(M^4O_4)_3X$, where each of $M^1$, $M^2$ and $M^3$ is a divalent alkaline earth metal including one or more of Mg, Ca, Sr, Ba and Eu. If equal to or below 15%, Mg and Ba may be included, and if equal to or below 3%, a monovalent alkali metal of one or more of Na, K, Rb and Cs and a trivalent metal of one or more of Sc, Y and La may be included. Further, if equal to or below 5%, $M^4$ may include Si and/or V.

It is advantageous that the blue phosphor is represented by a general formula of $(Ca_{1-x-y}, Sr_x, Eu_y)_5(PO_4)_3Cl$, and that the ratio of the content y of Eu to the content x+y of Sr and Eu is within a certain range. It is advantageous that an excitation spectrum of the blue phosphor represented by this general formula has a peak wavelength in a range of 350 nm to 420 nm, preferably, in a range of 390 nm to 410 nm.

The composition of the blue phosphor may be determined such that the emission color has a peak wavelength of 430 nm to 480 nm. This blue phosphor efficiently absorbs near ultraviolet rays or short-wavelength visible light, and emits light with a dominant wavelength of 440 nm to 470 nm.

The blue phosphor may be combined with a semiconductor light emitting device that emits ultraviolet rays or short-wavelength visible light to provide a light emitting module. For example, a white light emitting module may be provided by a combination of an ultraviolet light emitting device, a blue phosphor and a yellow phosphor. Alternatively, a white light emitting module may be provided by a combination of an ultraviolet light emitting device, a blue phosphor, a red phosphor and a green phosphor. Other phosphors may also be used to provide a desired chromaticity or color rendering. Phosphors other than the blue phosphor are not limited in particular, and well-known phosphors may be used.

Yellow Light Emitting Phosphor

As an advantageous example, a yellow light emitting phosphor (hereinafter, "yellow phosphor") according to this implementation is represented by a general formula of $M^1O_2 \cdot aM^2O \cdot bM^3X_2 : M^4_c$, where $M^1$ is one or more elements selected from a group consisting of Si, Ge, Ti, Zr and Sn, $M^2$ is one or more elements selected from a group consisting of Mg, Ca, Sr, Ba and Zn, $M^3$ is one or more elements selected from a group consisting of Mg, Ca, Sr, Ba and Zn, X is one or more halogen elements, and $M^4$ is one or more elements including $Eu^{2+}$ and optionally selected from a group consisting of rare earth elements and Mn, and where $0.1 \leq a \leq 1.3$ and $0.1 \leq b \leq 0.25$. The yellow phosphor is excited by the ultraviolet rays or the short-wavelength visible light to emit visible light that provides white light by being mixed with the visible light emitted by the blue phosphor. More specifically, the yellow phosphor emits visible light having a peak wavelength in a wavelength region of 560 nm to 600 nm.

Light Emitting Device

It is advantageous that a semiconductor light emitting device used in a light emitting module having the blue phosphor described above emit ultraviolet rays or a short-wavelength visible light having a peak wavelength in a wavelength region of 350 nm to 420 nm. For example, it is advantageous to use InGaN/GaN light emitting device that emits ultraviolet rays. With the InGaN/GaN light emitting device, the light emission peak wavelength is lengthened as the amount of In becomes larger, and the light emission peak wavelength is shortened as the amount of In becomes smaller. Accordingly, to adapt the InGaN/GaN light emitting device in the light emitting module, the amount of In can be adjusted such that the light emission peak wavelength becomes 350 nm to 420 nm.

The light emitting module according to this implementation includes the semiconductor light emitting device described above and phosphor including the blue phosphor. More specifically, the light emitting module may be configured such that a layer of the phosphor is provided on the semiconductor light emitting device. In this case, at least one kind of phosphor may be provided in a single layer or in a plurality of layers, or a plurality of kinds of phosphors may be mixed and provided in a single layer. To provide the phosphor layer on the semiconductor light emitting device, the phosphor may be mixed in a coating member for coating the surface of the semiconductor light emitting device, the phosphor may be mixed in a mold member, the phosphor may be mixed in a cover that covers the mold member, or the phosphor may be mixed in a transparent plate disposed in front of the semiconductor light emitting device in a light emitting direction of the lamp.

At least one kind of the phosphors may be added to the mold member on the semiconductor light emitting device. Alternatively, the phosphor layer of the at least one kind of the phosphors may be provided on an outer side of the light emitting module. To provide the phosphor layer on the outer side of the light emitting module, the phosphor may be applied on the outer surface of the mold member of the light emitting module in a layer manner, the phosphor may be dispersed in a rubber, resin, or elastomer to form a molded body (e.g., in a shape of a cap) that covers the semiconductor light emitting device, or the molded body may be formed in a flat plate and arranged in front of the semiconductor light emitting device.

Hereinafter, Examples of this implementation will be described in detail. Phosphors according to the following Examples and Comparative Examples are represented by a general formula of $(Ca_{1-x-y},Sr_x,Eu_y)_5(PO_4)_3Cl$, except Comparative Example 1.

EXAMPLE 1

A blue phosphor according to Example 1 is represented by a general formula of $(Ca_{1-x-y},Sr_x,Eu_y)_5(PO_4)_3Cl$, where $x=0.35$ and $y=0.040$. First, raw materials of $Ca_2P_2O_7$, $CaCO_3$, $SrCO_3$, $Eu_2O_3$ and $NH_4Cl$ were weighed so that a molar ratio of these materials is $Ca_2P_2O_7:CaCO_3:SrCO_3:Eu_2O_3:NH_4Cl=1.50:0.05:1.75:0.10:1.00$, and the weighed raw materials were ground and mixed in an alumina mortar to obtain a blended material. This blended material was put in an alumina crucible and was fired at a temperature of 1000° C. for 5 hours in an $N_2$ atmosphere including 2% to 5% of $H_2$ to obtain a fired product. This fired product was carefully washed in warm pure water to remove excess chloride, whereby the blue phosphor is produced.

EXAMPLE 2

A blue phosphor according to Example 2 is represented by a general formula of $(Ca_{1-x-y},Sr_x,Eu_y)_5(PO_4)_3Cl$, where $x=0.20$ and $y=0.016$. First, raw materials of $CaCO_3$, $SrCO_3$, $NH_4H_2PO_4$, $Eu_2O_3$ and $CaCl_2$ were weighed so that a molar ratio of these materials is $CaCO_3:SrCO_3:NH_4H_2PO_4:Eu_2O_3:CaCl_2=3.42:1.00:3.00:0.04:0.50$. Thereafter, the blue phosphor was produced by the same method as Example 1.

EXAMPLE 3

A blue phosphor according to Example 3 is represented by a general formula of $(Ca_{1-x-y},Sr_x,Eu_y)_5(PO_4)_3Cl$, where $x=0.20$ and $y=0.040$. First, raw materials of $CaCO_3$, $SrCO_3$, $NH_4H_2PO_4$, $Eu_2O_3$ and $NH_4Cl$ were weighed so that a molar ratio of these materials is $CaCO_3:SrCO_3:NH_4H_2PO_4:Eu_2O_3:NH_4Cl=3.80:1.00:3.00:0.10:1.00$. Thereafter, the blue phosphor was produced by the same method as Example 1.

EXAMPLE 4

A blue phosphor according to Example 4 is represented by a general formula of $(Ca_{1-x-y},Sr_x,Eu_y)_5(PO_4)_3Cl$, where $x=0.25$ and $y=0.040$. First, raw materials of $CaHPO_4$, $CaCO_3$, $SrCO_3$, $Eu_2O_3$ and $CaCl_2$ were weighed so that a molar ratio of these materials is $CaHPO_4:CaCO_3:SrCO_3:Eu_2O_3:CaCl_2=3.00:0.05:1.75:0.10:0.50$. Thereafter, the blue phosphor was produced by the same method as Example 1.

EXAMPLE 5

A blue phosphor according to Example 5 is represented by a general formula of $(Ca_{1-x-y},Sr_x,Eu_y)_5(PO_4)_3Cl$, where $x=0.20$ and $y=0.008$. First, raw materials of $CaHPO_4$, $CaCO_3$, $SrCO_3$, $Eu_2O_3$, $NH_4H_2PO_4$ and $NH_4Cl$ were weighed so that a molar ratio of these materials is $CaHPO_4:CaCO_3:SrCO_3:Eu_2O_3:NH_4H_2PO_4:NH_4Cl=3.00:0.96:1.00:0.02:0.01:1.00$. Thereafter, the blue phosphor was produced by the same method as Example 1.

EXAMPLE 6

A blue phosphor according to Example 6 is represented by a general formula of $(Ca_{1-x-y},Sr_x,Eu_y)_5(PO_4)_3Cl$, where $x=0.20$ and $y=0.020$. First, raw materials of $Ca_2P_2O_7$, $CaCO_3$, $SrCO_3$, $Eu_2O_3$ and $NH_4Cl$ were weighed so that a molar ratio of these materials is $Ca_2P_2O_7:CaCO_3:SrCO_3:Eu_2O_3:NH_4Cl=1.50:0.86:1.00:0.07:1.00$. Thereafter, the blue phosphor was produced by the same method as Example 1.

COMPARATIVE EXAMPLE 1

A blue phosphor according to Comparative Example 1 is represented by a general formula of $(Ca_{1-x-y}, Mg_x, Eu_y)_5(PO_4)_3Cl$. That is, Sr is not added. First, raw materials of $CaHPO_4$, $CaCO_3$, $MgCO_3$, $Eu_2O_3$ and $CaCl_2$ were weighed so that a molar ratio of these materials is $CaHPO_4:CaCO_3:MgCO_3:$ $Eu_2O_3:CaCl_2=3.00:1.17:0.50:0.04:0.50$. Thereafter, the blue phosphor was produced by the same method as Example 1.

COMPARATIVE EXAMPLE 2

A blue phosphor according to Comparative Example 2 is represented by a general formula of $(Ca_{1-x-y},Sr_x,Eu_y)_5(PO_4)_3Cl$, where $x=0.04$ and $y=0.002$. First, raw materials of $CaHPO_4$, $CaCO_3$, $SrCO_3$, $Eu_2O_3$ and $CaCl_2$ were weighed so that a molar ratio of these materials is $CaHPO_4:CaCO_3:SrCO_3:Eu_2O_3:NH_4Cl=3.00:1.79:0.20:0.005:1.00$. Thereafter, the blue phosphor was produced by the same method as Example 1.

COMPARATIVE EXAMPLE 3

A blue phosphor according to Comparative Example 3 is represented by a general formula of $(Ca_{1-x-y},Sr_x,Eu_y)_5(PO_4)_3Cl$, where $x=0.60$ and $y=0.040$. First, raw materials of $CaHPO_4$, $SrCO_3$, $Eu_2O_3$, $NH_4H_2PO_4$ and $NH_4Cl$ were weighted so that a molar ratio of these materials is $CaHPO_4:SrCO_3:Eu_2O_3:NH_4H_2PO_4:NH_4Cl=1.80:3.00:0.10:1.20:1.00$. Thereafter, the blue phosphor was produced by the same method as Example 1.

EXAMPLE 7

A blue phosphor according to Example 7 is determined by a general formula of $(Ca_{1-x-y},Sr_x,Eu_y)_5(PO_4)_3Cl$, where $x=0.35$ and $y=0.060$. First, raw materials of $CaHPO_4$, $SrCO_3$, $Eu_2O_3$, $NH_4H_2PO_4$ and $NH_4Cl$ were weighed so that a molar ratio of these materials is $CaHPO_4:SrCO_3:Eu_2O_3:NH_4H_2PO_4:NH_4Cl=2.95:1.75:0.15:0.05:1.00$. Thereafter, the blue phosphor was produced by the same method as Example 1.

COMPARATIVE EXAMPLE 4

A blue phosphor according to Comparative Example 4 is represented by a general formula of $(Ca_{1-x-y},Sr_x,Eu_y)_5(PO_4)_3Cl$, where $x=0.10$ and $y=0.016$. First, raw materials of $Ca_2P_2O_7$, $CaCO_3$, $SrCO_3$, $Eu_2O_3$ and $NH_4Cl$ were weighed so that a molar ratio of these materials is $Ca_2P_2O_7:CaCO_3:SrCO_3:Eu_2O_3:NH_4Cl=1.50:1.87:0.50:0.04:1.00$. Thereafter, the blue phosphor was produced by the same method as Example 1.

Composition Determining Method

The composition of each of the phosphors was determined by the following process.

(1) After confirming that a structure of a sample is a single phase by powder X-ray diffraction (XRD), the composition of the sample was analyzed by inductively coupled plasma (ICP) emission spectrometry.

(2) Because the result of semi-quantitative composition analysis of one particle of the same sample by using electron probe micro analyzer (EPMA) coincided with the value obtained by the ICP emission spectrometry, composition analysis with one particle was performed using EPMA with respect to all samples.

Light Resistance Evaluation Method

A light emitting module having a phosphor and a semiconductor light emitting device was prepared for each of the phosphors described above, and light resistance evaluation was performed. FIG. 1 is a schematic cross-sectional view of a light emitting module 10 according to one implementation. The light emitting module 10 includes a mount member 12, a semiconductor light emitting device 14, a frame member 16, and a fluorescent member 18. The semiconductor light emitting device 14 is secured on the mount member 12. On an upper side of the semiconductor light emitting device 14, the fluorescent member 18 is provided to cover the semiconductor light emitting device 14. The frame member 16 is secured on the mount member 12 to surround lateral sides of the semiconductor light emitting device 14.

The light emitting device may be an LED or a laser diode (LD) that emits ultraviolet rays or short-wavelength visible light. In this implementation, the semiconductor light emitting device 14 is a near ultraviolet LED (nUV-LED) having a peak wavelength of 405 nm, and emits near ultraviolet rays and short-wavelength visible light. The mount member 12 is, for example, a conductive adhesive such as silver paste or Au—Sn eutectic solder.

The fluorescent member 18 is a sheet of binder material in which the phosphor is dispersed. The binder material, may be, for example, silicon resin or fluorine resin. In particular, because the light emitting module uses ultraviolet rays or short-wavelength visible light as an excitation light source, it is advantageous to use a binder material having superior ultraviolet resistance, such as silicon resin.

According to this implementation, the seat thickness of the fluorescent member 18 was 120 μm, and the density of the dispersed phosphor was 30 vol %.

The light emitting module 10 having the configuration described above was driven by an input current of about 1 A to emit light of about 1 W/mm². Under this condition, an initial light emission intensity and light emission intensity after 1000 hours of light emission were measured for each of the light emitting modules including the respective phosphors.

The light emission intensity after 1000 hours is defined as (initial light emission intensity)×(light-resistance maintenance ratio after 1000 hours). In the evaluation, the light emitting module having the light emission intensity of 0.70 or higher after 1000 hours was regarded as acceptable level. This acceptable level is based on "TSC8153—Requirements for White LED Illumination Device Performance" published by Standards Board of Japanese Industrial Standards Committee.

Figure 2:
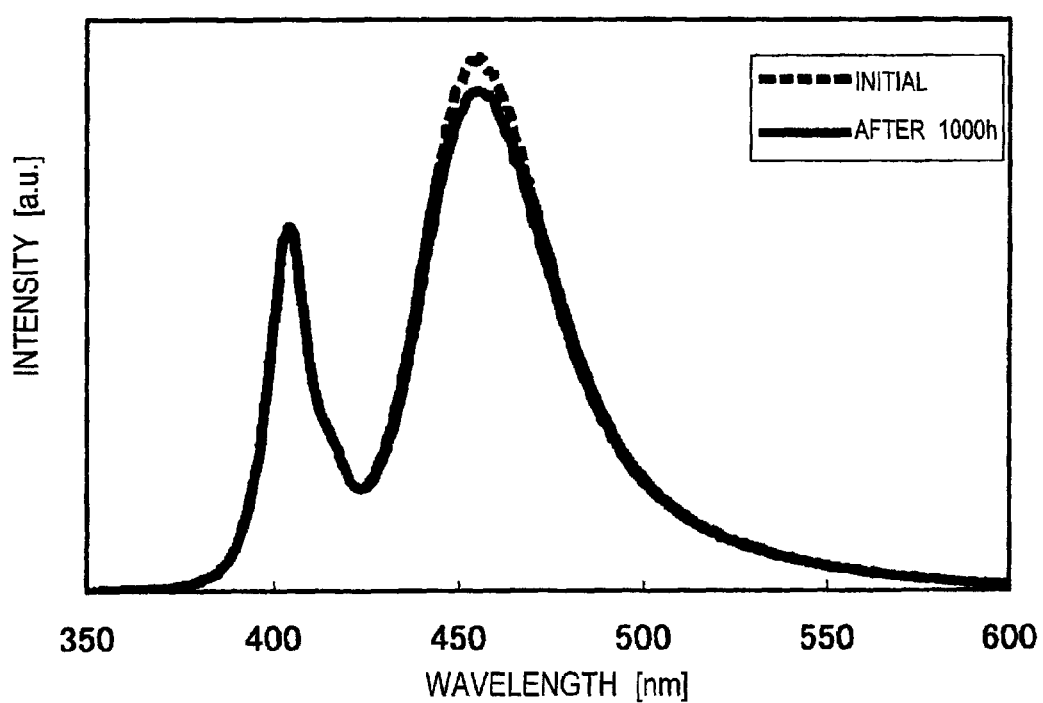
FIG. 2 is a diagram illustrating an initial emission spectrum and an emission spectrum after light emission for 1000 h according to a light emitting module of Example 1.
Figure 3:
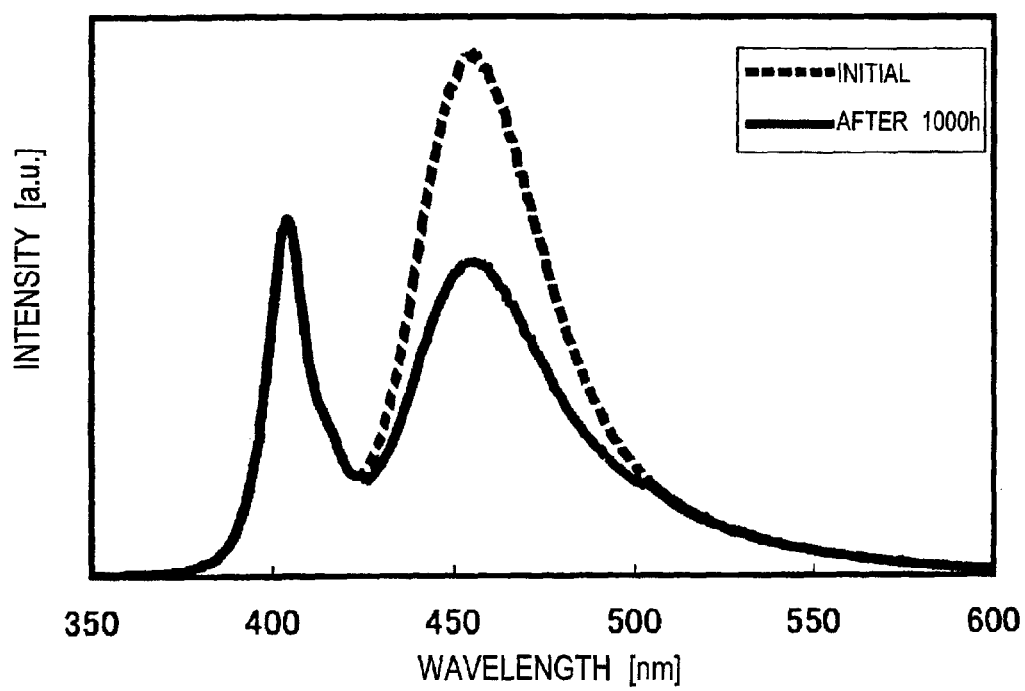
FIG. 3 is a diagram illustrating initial emission spectrum of a light emitting module and an emission spectrum after light emission for 1000 h according to Comparative Example 1.

The light resistance evaluation results with the light emitting modules having phosphors according to respective Examples and Comparative Examples are shown in Table 1. FIG. 2 is a diagram illustrating an initial emission spectrum and an emission spectrum after 1000 hours of light emission according to the light emitting module of Example 1, and FIG. 3 is a diagram illustrating an initial emission spectrum and an emission spectrum after1000 hours of light emission according to the light emitting module of Comparative Example 1.

TABLE 1

| No. | Sr Content [mol] | x | Eu Content [mol] | y | y/(x + y) | Light Resistance Maintenance Ratio @1000 h | Initial Light Emission Intensity | Light Emission Intensity after 1000 h |
|---|---|---|---|---|---|---|---|---|
| Ex. 1 | 1.75 | 0.35 | 0.20 | 0.040 | 0.103 | 95% | 1.02 | 0.97 |
| Ex. 2 | 1.00 | 0.20 | 0.08 | 0.016 | 0.074 | 102% | 0.95 | 0.97 |
| Ex. 3 | 1.00 | 0.20 | 0.20 | 0.040 | 0.167 | 79% | 1.00 | 0.79 |
| Ex. 4 | 1.25 | 0.25 | 0.20 | 0.040 | 0.138 | 89% | 1.02 | 0.91 |

TABLE 1-continued

| No. | Sr Content [mol] | x | Eu Content [mol] | y | y/(x + y) | Light Resistance Maintenance Ratio @1000 h | Initial Light Emission Intensity | Light Emission Intensity after 1000 h |
|---|---|---|---|---|---|---|---|---|
| Ex. 5 | 1.00 | 0.20 | 0.04 | 0.008 | 0.038 | 107% | 0.89 | 0.95 |
| Ex. 6 | 1.00 | 0.20 | 0.10 | 0.020 | 0.091 | 82% | 0.99 | 0.81 |
| Ex. 7 | 1.75 | 0.35 | 0.30 | 0.060 | 0.146 | 69% | 1.01 | 0.70 |
| Com. Ex. 1 | 0.00 | 0.00 | 0.06 | 0.012 | 1.000 | 56% | 1.00 | 0.56 |
| Com. Ex. 2 | 0.20 | 0.04 | 0.01 | 0.002 | 0.048 | — | 0.58 | — |
| Com. Ex. 3 | 3.00 | 0.60 | 0.20 | 0.040 | 0.063 | — | 0.47 | — |
| Com. Ex. 4 | 0.50 | 0.10 | 0.08 | 0.016 | 0.138 | 65% | 1.01 | 0.66 |

As shown in Table 1, the light emitting module according to Example 1 achieved the light resistance maintenance ratio of 95% when light emitting module was turned on for 1000 h. The light emitting modules according to other Examples also achieved the light resistance maintenance ratio of 70% or higher. Accordingly, in the light emitting module having a high output near-ultraviolet LED, a blue phosphor with a small reduction in light emission intensity was obtained.

According to Comparative Example 3, x was 0.60, i.e., the content of Sr was large, which resulted in low initial light emission intensity. In Comparative Examples 1 and 4, x was equal to or smaller than 0.10, i.e., the content of Sr was small, which resulted in large reduction of light emission intensity after 1000 hours. That is, the ultraviolet light resistance was low. On the other hand, the phosphors according to the respective Examples represented by the general formula of $(Ca_{1-x-y},Sr_x,Eu_y)_5(PO_4)_3Cl$, the parameter x having a correlation with the content of Sr was within the range of $0.10<x<0.60$.

According to Comparative Example 2, y was 0.002, i.e., the content of Eu was low, which resulted in low initial light emission intensity. In Example 7, y was 0.060, i.e., the content of Eu was high, which resulted in high initial light emission intensity, but the light resistance maintenance ratio was lower than 70%. On the other hand, the phosphors according to the respective Examples represented by the general formula of $(Ca_{1-x-y},Sr_x,Eu_y)_5(PO_4)_3Cl$, the parameter y having a correlation with the content of Eu was within the range of $0.002<y<0.060$.

In the light emitting modules according to the respective Examples, the initial light emission intensity was high, and the light resistance maintenance ratio was equal to or higher than 70%. In the phosphors of the respective Examples, the parameter y/(x+y) having a correlation with the ratio of the content of Eu to the total content of Sr and Eu was within the range of $0.020<y/(x+y)<0.17$. It is more preferable that the parameter y/(x+y) be within the range of $0.029 \leq y/(x+y) \leq 0.167$.

As described above, the blue phosphor represented by the general formula of $(Ca_{1-x-y},Sr_x,Eu_y)_5(PO_4)_3Cl$, where $0.10<x<0.60$, $0.002<y<0.060$, $0.02<y/(x+y)<0.17$, has an improved light resistance. Further, in the light emitting module including such a blue phosphor, the light resistance of the blue phosphor with respect to the ultraviolet or short-wavelength visible light is improved. Therefore, reduction in the light emission intensity after a long-term use is suppressed.

In particular, the blue phosphor is suitable as a phosphor of the light emitting module having a light emitting device capable of light output of equal to or higher than 400 mW. Preferably, by combining the phosphor with a light emitting device capable of light output of equal to or higher than 600 mW, more preferably, by combining the phosphor with a light emitting device capable of light output of equal to or higher than 800 mW, more significant light resistance effect can be obtained. That is, a long life can be obtained even with a light emitting module having a light emitting device of such a high light output.

It is advantageous to use a light emitting device configured to emit ultraviolet rays or short-wavelength visible light having the peak wavelength in the wavelength region of 350 nm to 420 nm. With such a light emitting device, while light can be obtained using phosphors having different light emitting spectrums, for example, the blue phosphor according to one of Examples and the yellow phosphor described above. White light can be obtained with a mixture of the blue light and the yellow light without directly using the light from the light emitting device. Further, because the reduction in the output of the blue light through the long-term use is suppressed, a aging color deviation of the white light produced by mixing with the yellow light is small.

The subject matter of the present disclosure is not limited to the implementation and examples described in detail above. Various changes and modifications can be made therein without departing from the scope of the present invention as defined by the appended claims.

A light emitting module and a phosphor according to an implementation of the invention can be used in various lamps, such as illumination lamps, display backlights, vehicle lamps, and the like.

What is claimed is:

1. A light emitting module comprising:
   a light emitting device that emits ultraviolet rays or short-wavelength visible light; and
   a blue phosphor that is excited by the ultraviolet rays or the short-wavelength visible light to emit visible light,
   wherein the blue phosphor is represented by a general formula of $(Ca_{1-x-y},Sr_x,Eu_y)_5(PO_4)_3Cl$, wherein $0.10<x<0.60$, $0.002<y<0.060$, and $0.02<y/(x+y)<0.17$.

2. The light emitting module according to claim 1, wherein the light emitting device is configured to provide a light output of equal to or higher than 400 mW.

3. The light emitting module according to claim 1, wherein the light emitting device emits the ultraviolet rays or the short-wavelength visible light having a peak wavelength in a wavelength region of 350 nm to 420 nm.

4. The light emitting module according to claim 1, further comprising a yellow phosphor that is excited by the ultraviolet rays or the short-wavelength visible light to emit visible light that produces white light by being mixed with the visible light emitted by the blue phosphor.

5. A phosphor represented by a general formula of $(Ca_{1-x-y},Sr_x,Eu_y)_5(PO_4)_3Cl$, wherein $0.10<x<0.60$, $0.002<y<0.060$, and $0.02<y/(x+y)<0.17$.

* * * * *